United States Patent
Ho et al.

(10) Patent No.: US 7,123,038 B1
(45) Date of Patent: Oct. 17, 2006

(54) METHOD AND APPARATUS FOR PERFORMING ON-CHIP SAMPLING OVER AN EXTENDED VOLTAGE RANGE

(75) Inventors: Ronald Ho, Mountain View, CA (US);
Robert J. Drost, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 434 days.

(21) Appl. No.: 10/739,473

(22) Filed: Dec. 17, 2003

(51) Int. Cl.
*G01R 31/02* (2006.01)
*H03K 5/22* (2006.01)

(52) U.S. Cl. ............... 324/763; 324/158.1; 327/91
(58) Field of Classification Search ............ 327/91–94; 324/763
See application file for complete search history.

(56) References Cited

U.S. PATENT DOCUMENTS 5,084,634 A * 1/1992 Gorecki .................. 327/91

OTHER PUBLICATIONS

Applications of On-Chip Samplers for Test and Measurement of Integrated Circuit Ron, Ho et al -Symp. VLSI Ciecuits Dig. Tech Pages, 1998-IEEExplore.org.*

* cited by examiner

*Primary Examiner*—Ha Tran Nguyen
*Assistant Examiner*—Emily Y Chan
(74) *Attorney, Agent, or Firm*—Park, Vaughan & Fleming, LLP

(57) ABSTRACT

One embodiment of the present invention provides a system that performs voltage sampling over an extended voltage range on a semiconductor chip. During operation, the system receives an input voltage at a node within the semiconductor chip. The system samples the input voltage through a first sampling pathway using NMOS pass gates, which latch the input voltage to produce a first output signal. This first output signal tracks the input voltage from ground up to a cut-off voltage for the nMOS pass gates. The system also samples the input voltage through a second sampling pathway using nMOS pass gates, which latch the input voltage to produce a second output signal. Prior to the NMOS pass gates along the second sampling pathway, the input voltage passes through a source-follower gate, which translates the input voltage down, so that the second output signal tracks the input voltage from a turn-on voltage of the source-follower gate up to $V_{dd}$. Next, the system combines the first and second output signals to produce a combined output signal, which tracks the input voltage over the extended voltage range from ground to $V_{dd}$.

18 Claims, 6 Drawing Sheets

METHOD AND APPARATUS FOR PERFORMING ON-CHIP SAMPLING OVER AN EXTENDED VOLTAGE RANGE

GOVERNMENT LICENSE RIGHTS

This invention was made with United States Government support under Contract No. NBCH020055 awarded by the Defense Advanced Research Projects Administration. The United States Government has certain rights in the invention.

BACKGROUND

1. Field of the Invention

The present invention relates to the design of on-chip circuitry for testing semiconductor chips. More specifically, the present invention relates to a method and an apparatus for performing voltage sampling on a semiconductor chip over an extended voltage range.

2. Related Art

On-chip samplers have been used to perform non-invasive probing of voltages on a semiconductor chip. This type of non-invasive probing is advantageous because it can significantly reduce the time required to test and debug a semiconductor chip. For example, FIG. 1 illustrates a simple on-chip sampler design. In FIG. 1, pass transistors M1 and M2 function as analog "flip-flops" which sample a voltage under test and present a modified version of the voltage to the gate of amplifying transistor M3. Amplifying transistor M3 converts this voltage into a current, which is multiplied and sent off-chip to a measuring device, such as an oscilloscope.

In order to calibrate the sampler's input-voltage-to-output-current conversion function, a separate gate M4 communicates an external calibration voltage to the amplifying transistor M3. This external calibration voltage produces a corresponding output, which is used to calibrate the input-voltage-to-output-current function.

During a subsequent voltage measurement operation, the analog flip-flop formed by pass transistors M1 and M2 can be clocked at a slightly different frequency from the chip clock, thereby causing the circuit to sample the on-chip waveform at a slightly different time offset for each cycle of an input signal. If performed properly, this sub-sampling technique can cause the circuit to display a nearly exact replica of the on-chip voltage waveform, but with an expanded time-base.

Unfortunately, the circuit illustrated in FIG. 1 cannot easily sample on-chip voltages near the power supply voltage $V_{dd}$. This is because the NMOS pass gates M1 and M2 will turn off when the input voltage rises to within a threshold of the gate voltage for the pass gates (which is asserted as $V_{dd}$). One solution to this problem is to use a higher power supply voltage to drive the gates of nMOS devices M1 and M2. This allows the nMOS gates M1 and M2 to continue to conduct because their gate voltages exceed any on-chip voltage being tested. Although this scheme can be made to work, the higher gate voltages can possibly destroy the gates. The risk of gate destruction can be greatly reduced by using thick-oxide I/O devices. Unfortunately, such thick-oxide I/O devices are slow, which can significantly reduce the bandwidth of the sampler. Another disadvantage is that an extra pin is required for the higher supply voltage, which involves additional expense. Moreover, routing the extra supply voltage around the chip can significantly increase routing complexity.

Hence, what is needed is a method and an apparatus for sampling on-chip voltages without the problems described above.

SUMMARY

One embodiment of the present invention provides a system that performs voltage sampling over an extended voltage range on a semiconductor chip. During operation, the system receives an input voltage at a node within the semiconductor chip. The system samples the input voltage through a first sampling pathway using NMOS pass gates, which latch the input voltage to produce a first output signal. This first output signal tracks the input voltage from ground up to a cut-off voltage for the nMOS pass gates. The system also samples the input voltage through a second sampling pathway using nMOS pass gates, which latch the input voltage to produce a second output signal. Prior to the nMOS pass gates along the second sampling pathway, the input voltage passes through a source-follower gate, which translates the input voltage down, so that the second output signal tracks the input voltage from a turn-on voltage of the source-follower gate up to $V_{dd}$. Next, the system combines the first and second output signals to produce a combined output signal, which tracks the input voltage over the extended voltage range from ground to $V_{dd}$.

In a variation on this embodiment, combining the first and second output signals involves tying the first and second output signals together to produce the combined output signal, which is communicated to a measuring device. In a further variation, the measuring device is located off chip.

In a variation on this embodiment, combining the first and second output signals involves: measuring the first output signal at a measuring device to produce a first measured voltage; measuring the second output signal at a measuring device to produce a second measured voltage; and mathematically combining the first and second measured voltages to produce the combined output signal.

In a further variation, mathematically combining the first and second measured voltages involves applying different scale factors or translations to the first and second measured voltages.

In a further variation, mathematically combining the first and second measured voltages involves compensating for phase error between the first and second output signals caused by differences in propagation delay through the first and second sampling pathways.

In a variation on this embodiment, the system performs a calibration operation by passing an external calibration voltage through a first calibration pathway, which is similar to the first sampling pathway, to produce a first calibration output signal. The system also passes the external calibration voltage through a second calibration pathway, which is similar to the second sampling pathway, to produce a second calibration output signal. Next, the system measures the first and second calibration output signals and uses the resulting measurements to calibrate subsequent voltage measurements.

In a further variation, the external calibration voltage is obtained from an off-chip voltage source.

In a variation on this embodiment, the first sampling pathway includes two nMOS pass gates that are clocked on different phases of a sampling clock signal. Similarly, the second sampling pathway includes two nMOS pass gates that are similarly clocked on different phases of the sampling clock signal.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Extended-Range Voltage Sampler

Figure 1:
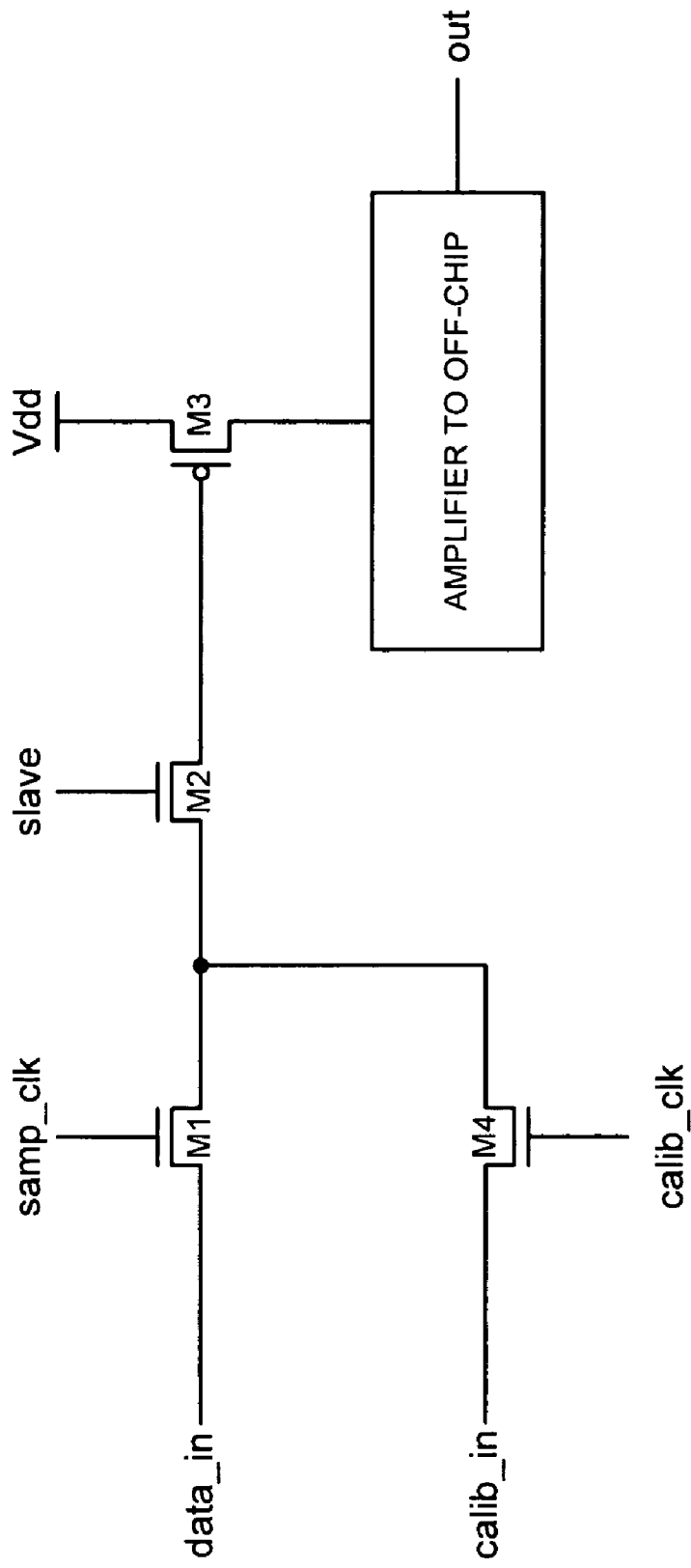
FIG. 1 illustrates a limited-range voltage sampler.
Figure 2:
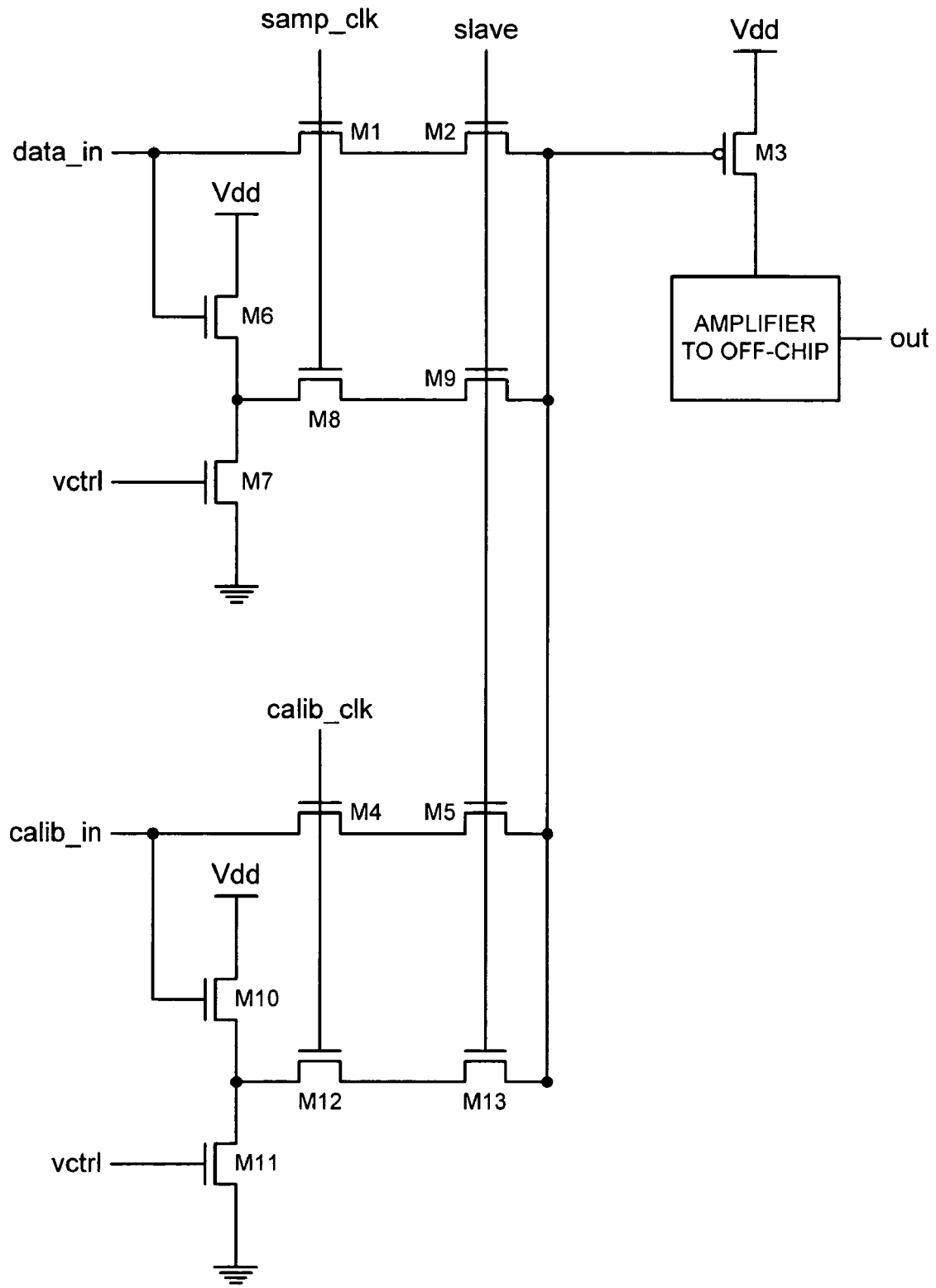
FIG. 2 illustrates an extended-range voltage sampler in accordance with an embodiment of the present invention.

FIG. 2 illustrates an extended-range voltage sampler in accordance with an embodiment of the present invention. This extended-range voltage sampler includes two parallel sampling pathways for both data and calibration voltages. The first pathway is identical to the pathway illustrated in FIG. 1. The second pathway is the same as the first pathway, except that it translates the voltage down using a source-follower gate (M6 for the data, M10 for the calibration pathway). Note that these source-follower gates (M6 and M10) are biased from a DC control signal through gates M7 and M11.

The two sampling pathways have similar voltage-transfer characteristics: the first pathway tracks the input voltage linearly until a cut-off voltage for the pass transistors (M1, M2, M4, and M5) is reached, while the second pathway tracks the input voltage linearly after a turn-on voltage for source follower gates (M6 and M10) is reached.

Note that during a preliminary calibration phase, a range of external calibration voltages are fed through the first and second sampling pathways. The resulting outputs are used to determine an input-voltage-to-output-current function. This function is subsequently used to determine which input voltages correspond to measured output voltages.

Transfer Characteristics

Figure 3:
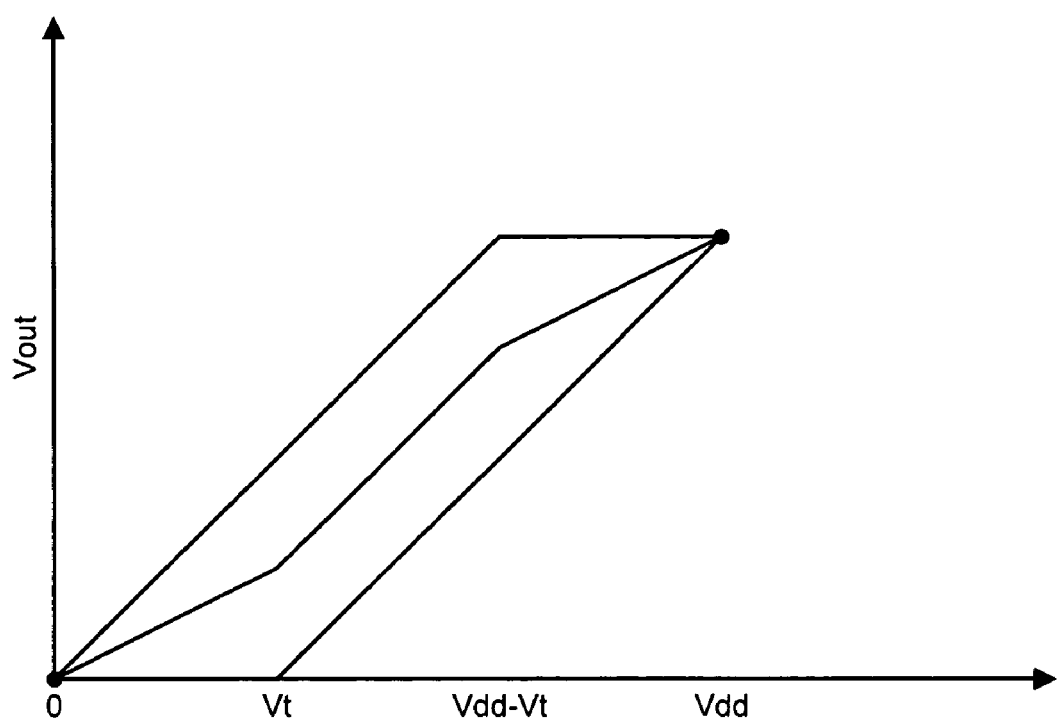
FIG. 3 presents a graph illustrating voltage-transfer characteristics of the extended-range voltage sampler illustrated in FIG. 2 in accordance with an embodiment of the present invention.

FIG. 3 presents a graph illustrating voltage-transfer characteristics of the extended-range voltage sampler in accordance with an embodiment of the present invention. The top curve in FIG. 3 illustrates transfer characteristics of the prior art sampler illustrated in FIG. 1. Note that this transfer curve is clipped at the upper end because nMOS pass gates M1 and M2 fail to conduct beyond their cutoff voltage $V_{dd}$-$V_t$.

The bottom curve illustrates transfer characteristics for the source-follower pathways. In this curve, the nMOS transistors (M6 and M10) of the source follower gates do not conduct until the input voltage exceeds $V_t$.

The middle curve illustrates transfer characteristics of a system that ties together the outputs of the two sampling pathways at the gate of the pMOS amplifier M3, thereby combining the two outer curves. Note that combining these signals earlier could potentially cause "back-washing" of charge onto the node being tested. Also note that this scheme introduces some amount of phase error between the first and second pathways, but this phase error is generally small.

Alternative Embodiment

Figure 4:
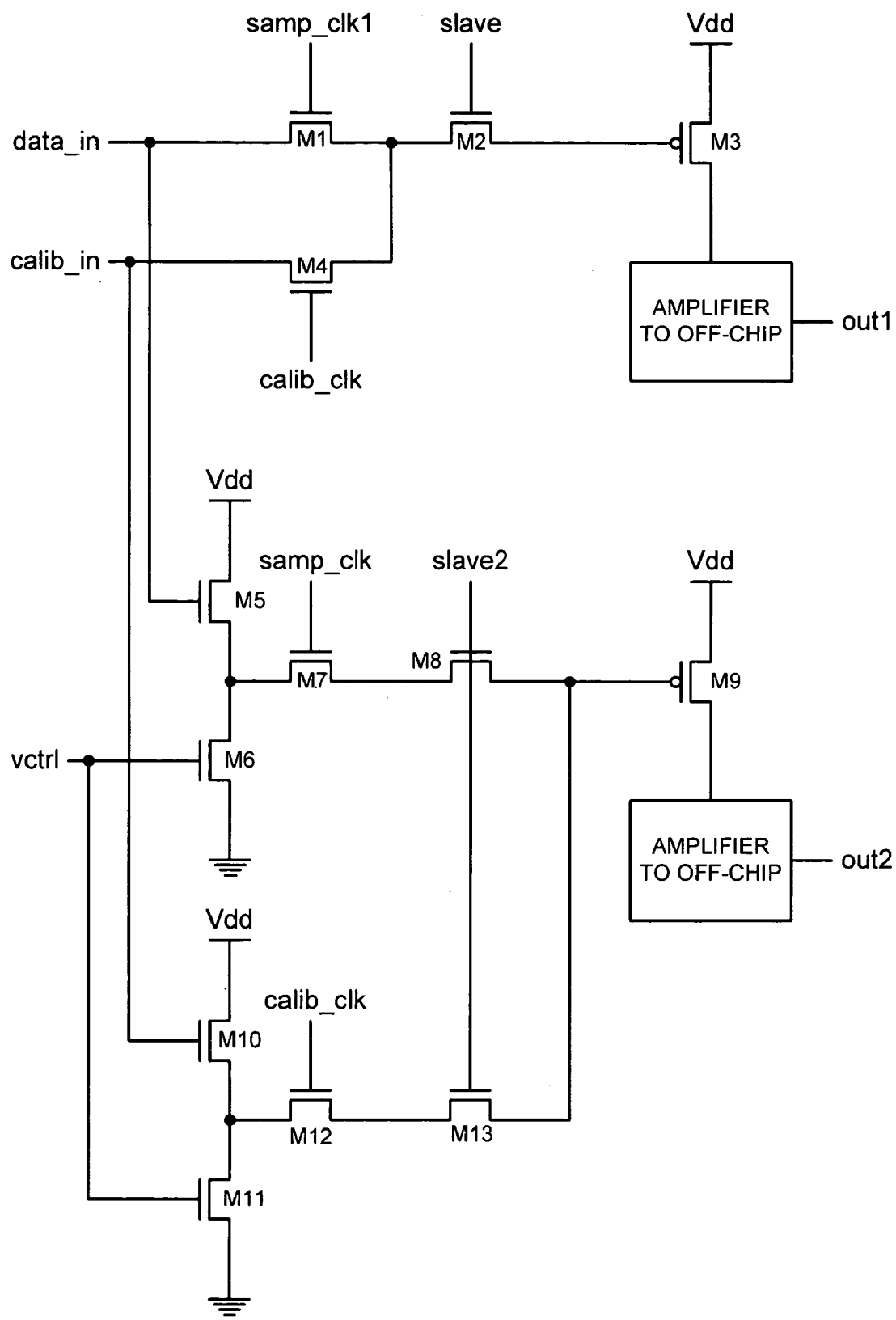
FIG. 4 illustrates an alternative embodiment of an extended range voltage sampler.

FIG. 4 illustrates an alternative embodiment of an extended range voltage sampler. In this alternative embodiment, two samplers, which generate two different outputs, sample the same test voltage "data_in." One is the traditional sampler illustrated in FIG. 1, and the other uses a sampler with a source-follower. Each sampler operates independently, and the measurements gathered from the samplers are captured in a computer. Furthermore, each of the samplers is calibrated independently, and the calibration functions also stored on the computer.

During operation, the system examines output waveforms from the two samplers using the calibration functions to determine which input voltages correspond to a particular pairs of output voltages for each of the two samplers. Using these correspondences, the two output waveforms can be stitched together to form a complete waveform representing the input signal. While this technique requires post-processing of the data, it generates a high-fidelity version of the input voltage, which is superior to the input voltages generated by the embodiment illustrated in FIG. 2 because it eliminates phase errors between the two pathways. The performance of this embodiment is discussed in more detail in the following section, which describes different voltage waveforms.

Voltage Waveforms

Figure 5A:
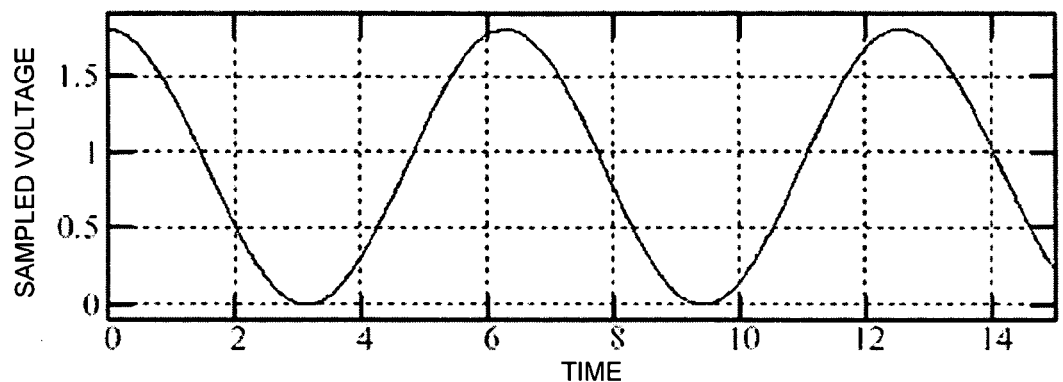
FIG. 5A illustrates an exemplary sinusoidal input signal.

FIG. 5A illustrates an exemplary sinusoidal input signal. This exemplary sinusoidal inputs signal ranges from 0V to 1.8V, although the actual voltages in a system will vary depending on the technology.

Figure 5B:
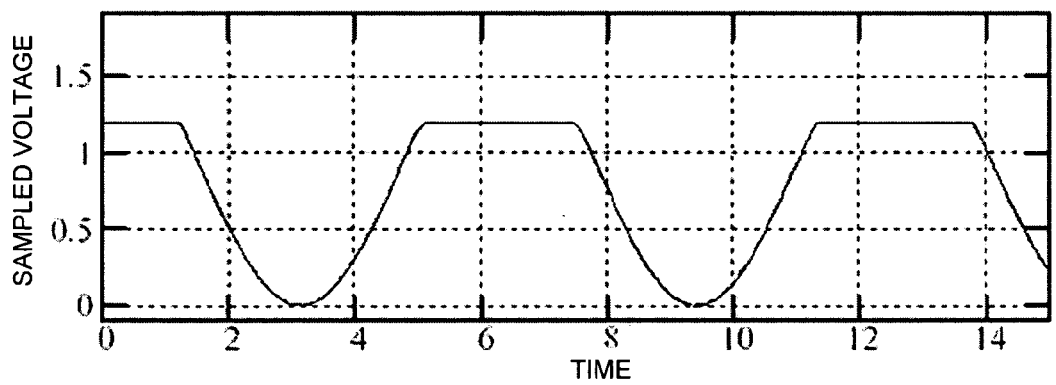
FIG. 5B illustrates a corresponding voltage waveform obtained by taking measurements through the prior art voltage sampler illustrated in FIG. 1.

FIG. 5B illustrates a corresponding voltage waveform obtained by taking measurements through the prior art voltage sampler illustrated in FIG. 1. Note that this voltage waveform clips after about 1.2V, which is the power supply voltage (1.8V) minus the threshold voltage of the NMOS pass transistors (0.6V). This voltage waveform illustrates why voltages between 1.2V and 1.8V cannot be measured accurately using the prior art voltage sampler from FIG. 1.

Figure 6A:
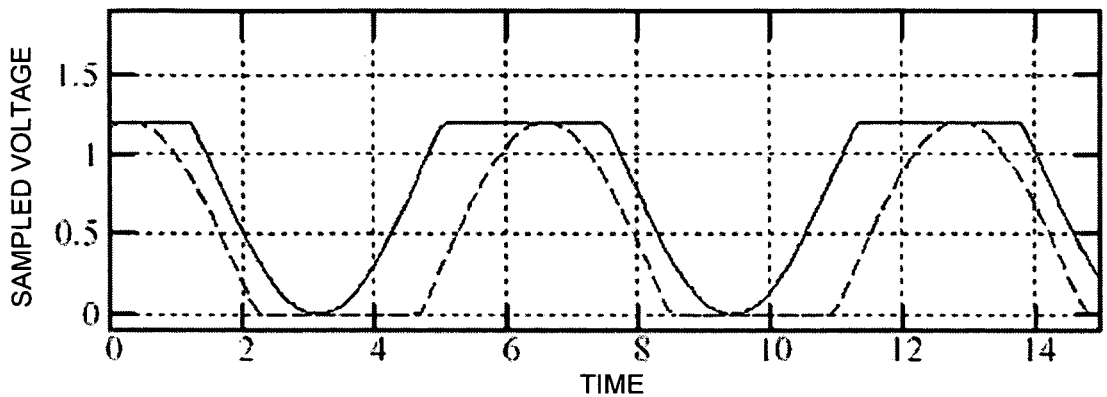
FIG. 6A illustrates voltage waveforms obtained from outputs of both sampling pathways in accordance with an embodiment of the present invention.

FIG. 6A illustrates voltage waveforms obtained by taking measurements from outputs of both sampling pathways in accordance with an embodiment of the present invention. The top-clipped waveform from FIG. 5B is repeated here, and the bottom-clipped waveform shows the result from feeding the sinusoidal input signal through the source-follower pathway. Note that the bottom-clipped waveform is slightly shifted to the right, because of the delay through the source-follower. The shifting is quite small (in this example about 10%) but appears somewhat larger because the waveform is also translated down in voltage.

Figure 6B:
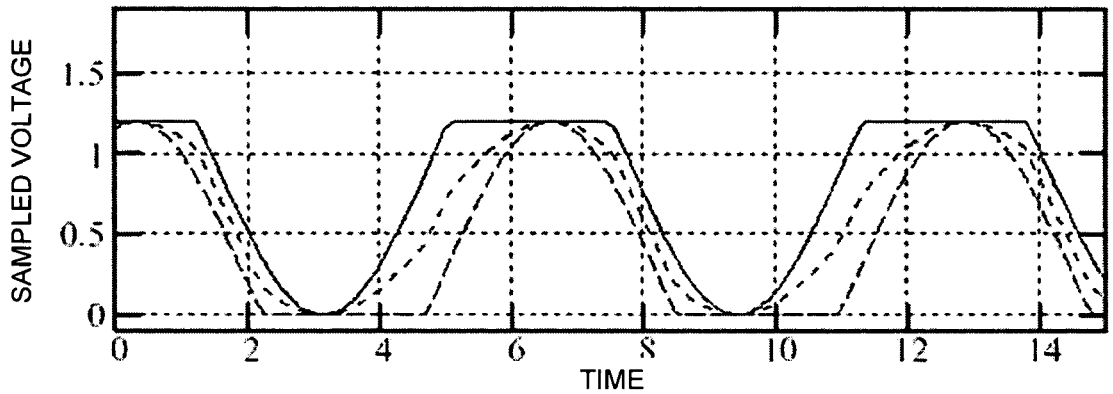
FIG. 6B illustrates voltage waveforms obtained from outputs of both sampling pathways that are averaged together in accordance with an embodiment of the present invention.

These two voltages can be combined by tying the outputs of the two sampling pathways together. This results in a circuit that generates the waveform illustrated in FIG. 6B. Note that the resulting waveform is an imperfect representation of the input sine wave because of differences in phase and scaling factor between the two output waveforms that make up the resulting waveform.

Figure 6C:
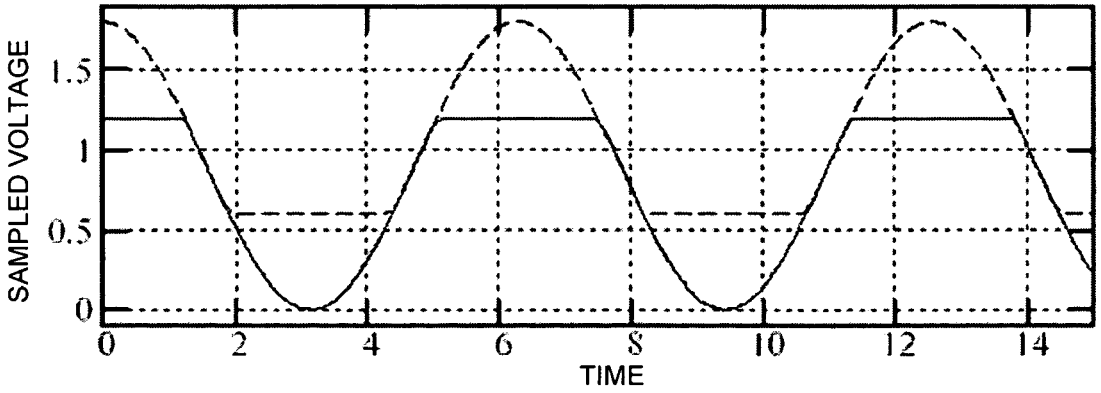
FIG. 6C illustrates voltage waveforms obtained from outputs of both sampling pathways which have been mathematically combined in accordance with an embodiment of the present invention.

Finally, FIG. 6C illustrates voltage waveforms from outputs of both sampling pathways, which have been mathematically combined off-line in accordance with the embodiment of the present invention illustrated in FIG. 4. In this embodiment, the two waveforms (the top-clipped and the bottom-clipped waveforms) can be independently measured and combined off-line through mathematical operations to produce a higher-fidelity waveform. These combining operations can involve applying different scaling factors to the waveforms and compensating for phase errors between the waveforms.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for performing voltage sampling over an extended voltage range on a semiconductor chip, comprising:

sampling an input voltage at a node within the semiconductor chip through a first sampling pathway using nMOS pass gates which latch the input voltage to produce a first output signal, wherein the first output signal tracks the input voltage from ground up to a cut-off voltage for the NMOS pass gates;

sampling the input voltage through a second sampling pathway using NMOS pass gates which latch the input voltage to produce a second output signal, wherein prior to the NMOS pass gates along the second sampling pathway, the input voltage passes through a source-follower gate, which translates the input voltage down, so that the second output signal tracks the input voltage from a turn-on voltage of the source-follower gate up to Vdd;

combining the first and second output signals to produce a combined output signal, which tracks the input voltage over the extended voltage range from ground to $V_{dd}$; and performing a calibration operation by:

passing an external calibration voltage through a first calibration pathway, which is similar to the first sampling pathway to produce a first calibration output signal, passing the external calibration voltage through a second calibration pathway, which is similar to the second sampling pathway, to produce a second calibration output signal, and measuring the first and second calibration output signals and using the resulting measurements to calibrate subsequent voltage measurements.

2. The method of claim 1, wherein combining the first and second output signals involves tying the first and second output signals together to produce the combined output signal, which is communicated to a measuring device.

3. The method of claim 2, wherein the measuring device is located off chip.

4. The method of claim 1, wherein combining the first and second output signals involves:

measuring the first output signal to produce a first measured voltage;

measuring the second output signal to produce a second measured voltage; and mathematically combining the first and second measured voltages to produce the combined output signal.

5. The method of claim 4, wherein mathematically combining the first and second measured voltages involves applying different scale factors or translations to the first and second measured voltages.

6. The method of claim 4, wherein mathematically combining the first and second measured voltages involves compensating for phase error between the first and second output signals caused by differences in propagation delay through the first and second sampling pathways.

7. The method of claim 1, wherein the external calibration voltage is obtained from an off-chip voltage source.

8. The method of claim 1, wherein the first sampling pathway includes two NMOS pass gates that are clocked on different phases of a sampling clock signal; and wherein the second sampling pathway includes two nMOS pass gates that are clocked on different phases of the sampling clock signal.

9. An apparatus that performs voltage sampling over an extended voltage range on a semiconductor chip, comprising:

an input that receives an input voltage from a node within the semiconductor chip;

a first sampling pathway, coupled to the input, including NMOS pass gates which latch the input voltage to produce a first output signal, wherein the first output signal tracks the input voltage from ground up to a cut-off voltage for the NMOS pass gates;

a second sampling pathway, coupled to the input, including NMOS pass gates which latch the input voltage to produce a second output signal, wherein prior to the nMOS pass gates, the second sampling pathway includes a source-follower gate, which translates the input voltage down, so that the second output signal tracks the input voltage from a turn-on voltage of the source-follower gate up to $V_{dd}$;

a combining mechanism configured to combine the first and second output signals to produce a combined output signal, which tracks the input voltage over the extended voltage range from ground to $V_{dd}$; and a calibration mechanism configured to:

pass an external calibration voltage through a first calibration pathway, which is similar to the first sampling pathway, to produce a first calibration output signal, pass the external calibration voltage through a second calibration pathway, which is similar to the second sampling pathway, to produce a second calibration output signal, and to measure the first and second calibration output signals and to use the resulting measurements to calibrate subsequent voltage measurements.

10. The apparatus of claim 9, wherein the combining mechanism is configured to tie the first and second output signals together to produce the combined output signal, which is communicated to a measuring device.

11. The apparatus of claim 10, wherein the measuring device is located off-chip.

12. The apparatus of claim 9, wherein the combining mechanism is configured to:
   measure the first output signal to produce a first measured voltage;
   measure the second output signal to produce a second measured voltage; and to
   mathematically combine the first and second measured voltages to produce the combined output signal.

13. The apparatus of claim 12, wherein mathematically combining the first and second measured voltages involves applying different scale factors or translations to the first and second measured voltages.

14. The apparatus of claim 12, wherein mathematically combining the first and second measured voltages involves compensating for phase error between the first and second output signals caused by differences in propagation delay through the first and second sampling pathways.

15. The apparatus of claim 9, wherein the external calibration voltage is obtained from an off-chip voltage source.

16. The apparatus of claim 9,
   wherein the first sampling pathway includes two nMOS pass gates that are clocked on different phases of a sampling clock signal; and
   wherein the second sampling pathway includes two nMOS pass gates that are clocked on different phases of the sampling clock signal.

17. The apparatus of claim 9, further comprising an amplifier configured to amplify output signals to be transmitted off chip.

18. An apparatus that performs voltage sampling over an extended voltage range on a semiconductor chip, comprising:
   an input that receives an input voltage from a node within the semiconductor chip;
   a first sampling pathway, coupled to the input, including NMOS pass gates which latch the input voltage to produce a first output signal, wherein the first output signal tracks the input voltage from ground up to a cut-off voltage for the NMOS pass gates;
   wherein the first sampling pathway includes two NMOS pass gates that are clocked on different phases of a sampling clock signal;
   a second sampling pathway, coupled to the input, including nMOS pass gates which latch the input voltage to produce a second output signal, wherein prior to the NMOS pass gates, the second sampling pathway includes a source-follower gate, which translates the input voltage down, so that the second output signal tracks the input voltage from a turn-on voltage of the source-follower gate up to $V_{dd}$;
   wherein the second sampling pathway includes two NMOS pass gates that are clocked on different phases of the sampling clock signal;
   a combining mechanism configured to combine the first and second output signals to produce a combined output signal, which tracks the input voltage over the extended voltage range from ground to $V_{dd}$; and
   a calibration mechanism configured to,
      pass an external calibration voltage through a first calibration pathway, which is similar to the first sampling pathway, to produce a first calibration output signal,
      pass the external calibration voltage through a second calibration pathway, which is similar to the second sampling pathway, to produce a second calibration output signal, and to
   measure the first and second calibration output signals and to correlate the resulting measurements the external calibration voltage to calibrate subsequent voltage measurements.

* * * * *